US010130963B2

(12) United States Patent
Zhang

(10) Patent No.: US 10,130,963 B2
(45) Date of Patent: Nov. 20, 2018

(54) SIPHON-TYPE AIRBRUSH

(71) Applicant: Minggui Zhang, Fenghua, Zhejiang (CN)

(72) Inventor: Minggui Zhang, Fenghua (CN)

( * ) Notice: Subject to any disclaimer, the term of this patent is extended or adjusted under 35 U.S.C. 154(b) by 0 days.

(21) Appl. No.: 15/318,669

(22) PCT Filed: Jan. 19, 2016

(86) PCT No.: PCT/CN2016/071343
§ 371 (c)(1),
(2) Date: Dec. 13, 2016

(87) PCT Pub. No.: WO2017/049820
PCT Pub. Date: Mar. 30, 2017

(65) Prior Publication Data

US 2017/0297046 A1 Oct. 19, 2017

(30) Foreign Application Priority Data

Sep. 23, 2015 (CN) .................... 2015 2 0743552 U

(51) Int. Cl.

| | |
|---|---|
| ***B05B 11/06*** | (2006.01) |
| ***B05B 1/30*** | (2006.01) |
| ***B05B 7/06*** | (2006.01) |
| ***B05B 7/12*** | (2006.01) |
| ***B05B 7/24*** | (2006.01) |
| *B05B 12/00* | (2018.01) |
| *B05B 7/00* | (2006.01) |

(52) U.S. Cl.
CPC ............ *B05B 11/06* (2013.01); *B05B 1/3046* (2013.01); *B05B 7/064* (2013.01); *B05B 7/1218* (2013.01); *B05B 7/2435* (2013.01); *B05B 7/2483* (2013.01); *B05B 7/00* (2013.01); *B05B 12/002* (2013.01); *H05K 999/99* (2013.01)

(58) Field of Classification Search
CPC ..... B05B 11/06; B05B 7/2435; B05B 7/2483; B05B 7/00; B05B 7/1218; B05B 7/064; B05B 1/3046; B05B 12/002; H05K 999/99
See application file for complete search history.

(56) References Cited

U.S. PATENT DOCUMENTS 4,161,289 A * 7/1979 Rebold ................ B05B 7/2435 239/346
5,961,050 A * 10/1999 Kitajima .............. B05B 7/1209 239/346

(Continued)

*Primary Examiner* — Steven J Ganey
*Assistant Examiner* — Joel Zhou

(57) ABSTRACT

A siphon-type airbrush, comprising a front handle, a tail handle, a needle, a sprayer, a nozzle, an air inlet valve and a nozzle base; the front handle corresponds to the tail handle to form an airbrush body; the airbrush body is internally formed with an accommodating cavity; the accommodating cavity is internally provided with the needle; the front handle is internally provided with a siphon channel; the air inlet valve is disposed at the middle part of the airbrush body; the rear end of the nozzle base is in threaded connection with the front handle; the front end of the nozzle base is in threaded connection with the sprayer; the nozzle comprises a nozzle body; the nozzle body is pressed between the sprayer and the nozzle base; the front end of the nozzle body extends to form a nozzle tip.

7 Claims, 4 Drawing Sheets

(56) References Cited

U.S. PATENT DOCUMENTS

| | | | | |
|---|---|---|---|---|
| 6,354,517 | B1 * | 3/2002 | Wu | B05B 7/1209<br>239/353 |
| 2014/0339338 | A1 * | 11/2014 | Saito | B05B 15/001<br>239/398 |

* cited by examiner

SIPHON-TYPE AIRBRUSH

BACKGROUND OF THE INVENTION

Technical Field

The utility model relates to the technical field of airbrushes, in particular to a siphon-type airbrush.

Description of Related Art

Airbrushes are important painting tools capable of spraying vaporific paint to achieve uniform coloring. Airbrushes are widely used in the fields of decoration design, outdoor advertisement, publication printing, movies and cartoons. Common airbrushes on the market are mainly classified into gravity-type and siphon-type, according to the paint delivery mode. The principle of the siphon-type airbrush is that compressed air is used to generate a negative pressure at the position of the nozzle, such that the paint in the paint bottle is siphoned into the nozzle to be sprayed out. For existing siphon-type airbrushes, the nozzle is usually installed at the front end of a front handle by means of a sprayer. However, this configuration usually results in relatively a complicated structure setting of the front handle, increasing difficulties in processing, in particular the difficulties in processing of the internal air channel of the front handle, thus causing high manufacturing cost. In addition, the nozzle is connected with the front handle merely through the sprayer. Consequently, the positional stability of the nozzle is difficult to maintain after installation, resulting in low coaxiality between the nozzle and the sprayer, and affecting the normal use of the airbrush.

BRIEF SUMMARY OF THE INVENTION

The objective of the utility model is to provide a siphon-type airbrush, which has a simple and rational structure, low manufacturing cost, high stability and is conveniently processed and used, to overcome the defects and shortcomings in the prior art.

To fulfill the above objective, the utility model employs the following technical solution:

A siphon-type airbrush of the utility model includes a front handle, a tail handle, a needle, a sprayer, a nozzle and an air inlet valve. The front handle is connected to the tail handle to form an airbrush body. The airbrush body is internally formed with an accommodating cavity. The accommodating cavity is internally provided with a needle. A feeding joint is disposed on the wall of the front handle. The front handle is internally provided with a siphon channel which communicates with the feeding joint. The air inlet valve is disposed at the middle part of the airbrush body. The accommodating cavity is internally provided with a trigger for controlling the the air inlet valve on/off. The triggering end of the trigger extends out of the front handle. The trigger is matched with the needle via a linkage. The airbrush also includes a nozzle base; the rear end of the nozzle base is in threaded connection with the front handle; and the front end of the nozzle base is in threaded connection with the sprayer. The nozzle includes a nozzle body; the nozzle body is pressed between the sprayer and the nozzle base; and the front end of the nozzle body extends to form a nozzle tip. An axial through-hole is disposed in the center of the nozzle base. The siphon channel communicates with the axial through-hole. The front end of the needle passes through the axial through-hole, and the nozzle body extends into the nozzle tip. An air chamber is formed among the sprayer, the nozzle body and the nozzle tip. The front handle, the nozzle base, and the nozzle body are matched to form an air channel which connects the air outlet of the air inlet valve and the air chamber. A radial gap which connects the air chamber and the surrounding air is formed between the front end of the sprayer and the nozzle tip.

Further, sealing rings are respectively disposed between the front handle and the nozzle base, between the nozzle base and the sprayer, and between the nozzle base and the nozzle body.

Further, the accommodating cavity is also internally provided with an ejector rod; the front end of the ejector rod is axially provided with a slot to be inserted by the needle; and the rear end of the ejector rod extends out of the tail handle and is fixedly connected with a button. The needle is fixedly connected with a locking nut which corresponds to the front end of the ejector rod in a stopper. Also, a tail handle screw is disposed between the ejector rod and the tail handle in a sleeving way. The tail handle screw is in threaded connection with the tail handle. A locking sleeve is movably connected between the tail handle screw and the button. A pair of mounting holes is symmetrically disposed on the wall of the tail handle screw. Each of the mounting holes is internally and movably equipped with a steel ball. The outer circumference of the rear end of the ejector rod is provided with a first step portion and a second step portion, which are matched with the steel balls, in turn from the front to the rear. The diameter of the first step portion is greater than that of the second step portion. An annular deep well and an annular shallow well, which are matched with the steel balls, are disposed on the inner wall of the locking sleeve in turn from the front to the rear. The annular deep well and the annular shallow well run through each other. A limiting boss matched with the rear end of the tail handle screw in a stopper is disposed at the middle part of the locking sleeve. A button spring is disposed between the limiting boss and the button.

Further, the front handle and the tail handle are connected through a connecting screw; the exterior of the needle is respectively sleeved with an adjusting rod and a spring adjusting screw; an adjusting rod spring is disposed between the adjusting rod and the spring adjusting screw; the rear end of the adjusting rod passes through the spring adjusting screw and then is in threaded connection with the locking nut; the rear end of the adjusting rod is axially provided with a clamping groove; when the locking nut is in threaded connection with the adjusting rod, the rear end of the adjusting rod shrinks with the stress and clamps the needle by the effect of the clamping groove; and the spring adjusting screw is in threaded connection with the connecting screw.

The trigger is provided with a linkage block for driving the needle to move axially; the linkage block is an eccentric arc structure; the outer circumference of the linkage block is pressed against the adjusting rod; the front end of the adjusting rod extends to form a connecting portion; and one end, away from the trigger, of the linkage block is movably sleeved with the connecting portion.

The tail handle is provided with a gap at a position corresponding to the spring adjusting screw.

Further, the air inlet valve comprises a valve body; one end of the valve body is fixedly connected with the front handle; the other end of the valve body is provided with an air inlet connector; the valve body is provided with an air outlet; the air inlet connector is internally provided with a valve rod and a switching hole, respectively; one end of the valve rod successively passes through the switching hole and the valve and is pressed against the trigger; the other end of the valve rod is provided with a sealing base matched with the switching hole in a sealing way; the air inlet connector is also internally provided with a valve rod adjusting screw; and an air inlet valve spring is disposed between the valve rod adjusting screw and one end, close to the sealing base, of the valve rod.

Further, the accommodating cavity is internally provided with a tapered sealing ring and a sealing ring cap in turn from the front to the rear; the sealing ring cap and the tapered sealing ring are both disposed between the nozzle base and the trigger; the sealing ring cap is in threaded connection with the front handle; and the tapered sealing ring is pressed between the front handle and the sealing ring cap.

Further, the exterior of the sprayer is connected and provided with a sprayer sleeve.

The utility model has the following beneficial effects: According to the utility model, the front end of the front handle is in threaded connection with the nozzle base, realizing installation and fixation of the sprayer and the nozzle through the nozzle base. Compared with the prior art, where the front handle is directly equipped with the nozzle through the sprayer, the utility model effectively optimizes the connection structure of the front handle, simplifies the structure setting of the front handle, and brings more convenience in processing of the air channel in the front handle, so the processing is convenient and the manufacturing cost is reduced. Additionally, the nozzle body is pressed between the sprayer and the nozzle base, which makes the assembling of the nozzle quick and convenient, effectively improving the stability of the nozzle position state, providing adequate assurance of the coaxiality between the nozzle tip and the sprayer, and enhancing the performance of the invention.

BRIEF DESCRIPTION OF THE SEVERAL VIEWS OF THE DRAWINGS

As shown in FIGS. 1-6: 1. Front handle; 11. feeding joint; 12. siphon channel; 2. tail handle; 21. connecting screw; 22. gap; 3. needle; 31. locking nut; 32. adjusting rod; 321. clamping groove; 322. connecting portion; 33. spring adjusting screw; 34. adjusting rod spring; 4. sprayer; 41. sprayer sleeve; 51. nozzle body; 52. nozzle tip; 61. valve body; 62. air inlet connector; 63. air outlet; 64. valve rod; 65. switching hole; 66. sealing base; 67. valve rod adjusting screw; 68. inlet valve spring; 7. accommodating cavity; 71. trigger; 711. linkage block; 72. tapered sealing ring; 73. sealing ring cap; 8. nozzle base; 81. axial through-hole; 82. air channel; 83. sealing ring; 9. ejector rod; 91. slot; 92. first step portion; 93. second step portion; 10. button; 101 button spring; 111 tail handle screw; 112. steel ball; 121. locking sleeve; 122. annular deep well; 123. annular shallow well; 124. limiting boss; A. air chamber.

DETAILED DESCRIPTION OF THE INVENTION

Figure 1:
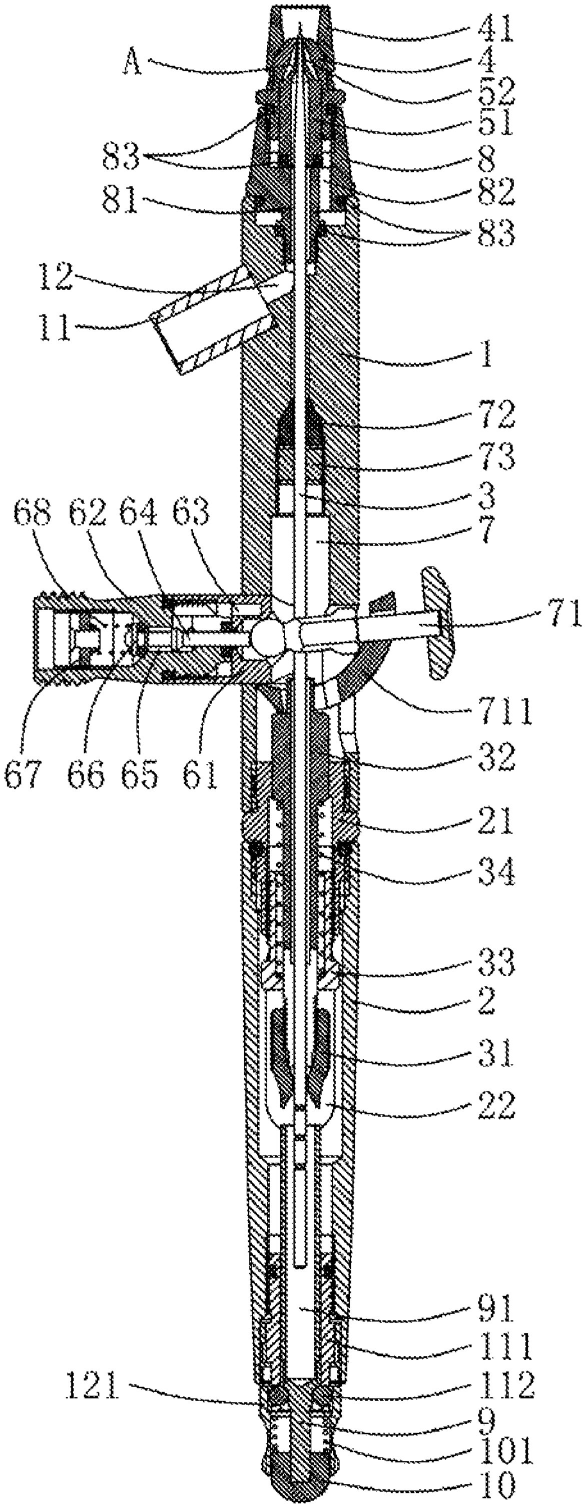
FIG. 1 is a schematic view of the overall structure of the utility model.

The utility model is further described in conjunction with the attached drawings.

As shown in FIGS. 1-6, a siphon airbrush includes a front handle 1, a tail handle 2, a needle 3, a sprayer 4, a nozzle and an air inlet valve. The front handle 1 is connected to the tail handle 2 to form an airbrush body. An accommodating cavity 7 is formed in the airbrush body. The accommodating cavity 7 is internally provided with the needle 3. A feeding joint 11 is disposed on the wall of the front handle 1. The feeding joint 11 is used for connecting a paint bottle. The front handle 1 is internally provided with a siphon channel 12 which communicates with the feeding joint 11. The air inlet valve is disposed at the middle part of the airbrush body. The accommodating cavity 7 is internally provided with a trigger 71 for controlling the air inlet valve on/off. A triggering end of the trigger 71 extends out of the front handle 1. The trigger 71 is matched with the needle 3 via linkage.

The siphon-type airbrush also includes a nozzle base 8. The rear end of the nozzle base 8 is in threaded connection with the front handle 1. The front end of the nozzle base 8 is in threaded connection with the sprayer 4. The exterior of the sprayer 4 is connected and provided with a sprayer sleeve 41. The sprayer sleeve 41 is used for protecting the needle 3. The nozzle includes a nozzle body 51. The nozzle body 51 is pressed between the sprayer 4 and the nozzle base 8. The front end of the nozzle body 51 extends to form a nozzle tip 52. An axial through-hole 81 is formed in the center of the nozzle base 8. The siphon channel 12 communicates with the axial through-hole 81. The front end of the needle 3 passes through the axial through-hole 81 and the nozzle body 51, and then extends into the nozzle tip 52. An air chamber A is formed among the sprayer 4, the nozzle body 51 and the nozzle tip 52. The front handle 1, the nozzle base 8 and the nozzle body 51 are matched to form an air channel 82, which connects an air outlet 63 of the air inlet valve and the air chamber A. A radial gap, which connects the air chamber A and the surrounding air is formed between the front end of the sprayer 4 and the nozzle tip 52.

According to the utility model, the front end of the front handle 1 is in threaded connection with the nozzle base 8, realizing installation and fixation of the sprayer 4 and the nozzle through the nozzle base 8. Compared with the prior art where the front handle 1 is directly equipped with the nozzle through the sprayer 4, the utility model effectively optimizes the connection structure of the front handle 1, simplifies the structure setting of the front handle 1, and processes the air channel 82 more effectively in the front handle 1. Consequently, the manufacturing cost is reduced. Additionally, the nozzle body 51 is pressed between the sprayer 4 and the nozzle base 8, which makes the assembling of the nozzle quick and convenient, effectively improves the stability of the nozzle position state, aids adequate assurance of the coaxiality between the nozzle tip 52 and the sprayer 4, and improves the use effect of the utility model.

During operation, compressed air passes through the air inlet valve and the air channel 82 in turn and then enters the air chamber A, and is sprayed out via the radial gap between the front end of the sprayer 4 and the nozzle tip 52. In the process of spraying the air out from the sprayer 4, the compressed air near the front end of the sprayer 4 generates a negative pressure at the position of the nozzle tip 52 to suck the paint in the siphon channel 12 from the nozzle, and the paint is atomized by the compressed air sprayed from the front end of the sprayer 4 while being sprayed via the nozzle tip 52, thus achieving the atomized painting effect.

Sealing rings 83 are respectively disposed between the front handle 1 and the nozzle base 8, between the nozzle base 8 and the sprayer 4, and between the nozzle base 8 and the nozzle body 51. With this configuration, the isolation between the compressed air and the paint in the siphon-type airbrush is fully ensured, so that the compressed air does not affect the paint in the process of flowing in the air channel 82, thus ensuring the stability of the working performance of the airbrush.

Referring to FIGS. 1, 2, 3, 4 and 5, the accommodating cavity 7 is also internally provided with an ejector rod 9. The front end of the ejector rod 9 is axially provided with a slot 91 to be inserted by the needle 3. The rear end of the ejector rod 9 extends out of the tail handle 2 and is fixedly connected with a button 10. The needle 3 is fixedly connected with a locking nut 31, which is matched with the front end of the ejector rod 9 in a stopper. A tail handle screw 111 is disposed between the ejector rod 9 and the tail handle 2. The tail handle screw 111 is in threaded connection with the tail handle 2. A locking sleeve 121 is movably connected between the tail handle screw 111 and the button 10. A pair of mounting holes is symmetrically disposed on the wall of the tail handle screw 111. Each of the mounting holes is internally and movably equipped with a steel ball 112. The outer circumference of the rear end of the ejector rod 9 is provided with a first step portion 92 and a second step portion 93, which correspond to the steel balls 112 in turn from the front to the rear. The diameter of the first step portion 92 is greater than that of the second step portion 93. An annular deep well 122 and an annular shallow well 123, which correspond to the steel balls 112, are disposed on the inner wall of the locking sleeve 121 in turn from the front to the rear. The annular deep well 122 and the annular shallow well 123 run through each other. A limiting boss 124 corresponding to the rear end of the tail handle screw 111 in a stopper is disposed at the middle part of the locking sleeve 121. A button spring 101 is disposed between the limiting boss 124 and the button 10.

Figure 2:
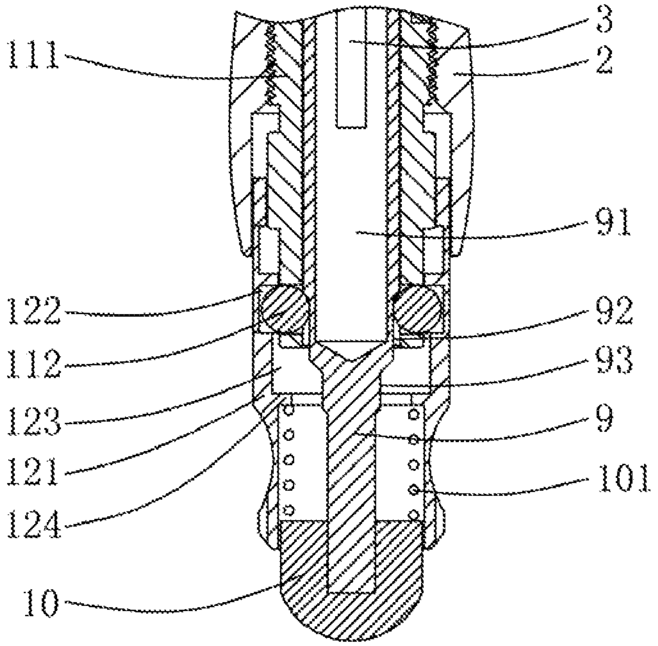
FIG. 2 is a schematic view of a partial structure of the utility model in a locked state.
Figure 3:
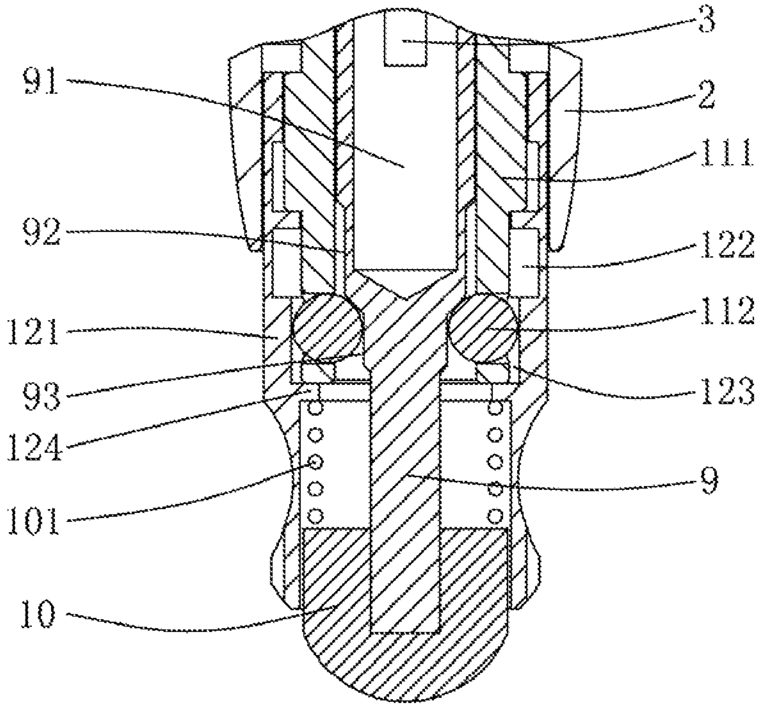
FIG. 3 is a schematic view of a partial structure of the utility model in another locked state.
Figure 4:
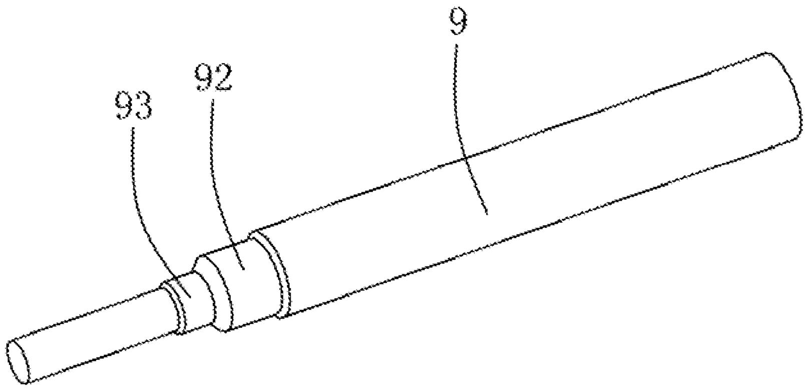
FIG. 4 is a structural view of an ejector rod of the utility model.
Figure 5:
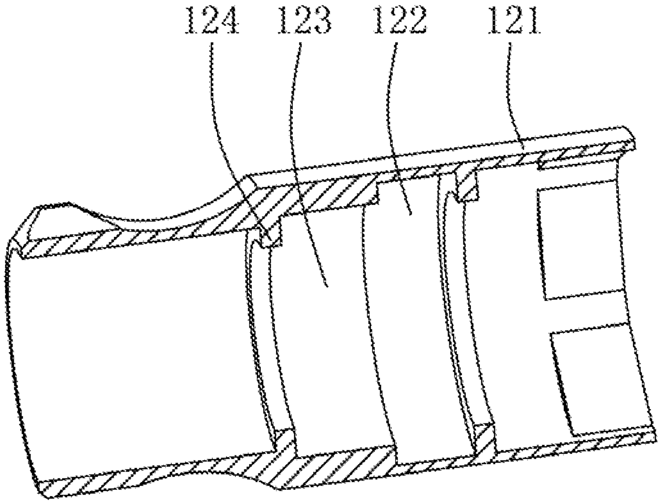
FIG. 5 is a structural view of a locking sleeve of the utility model.
Figure 6:
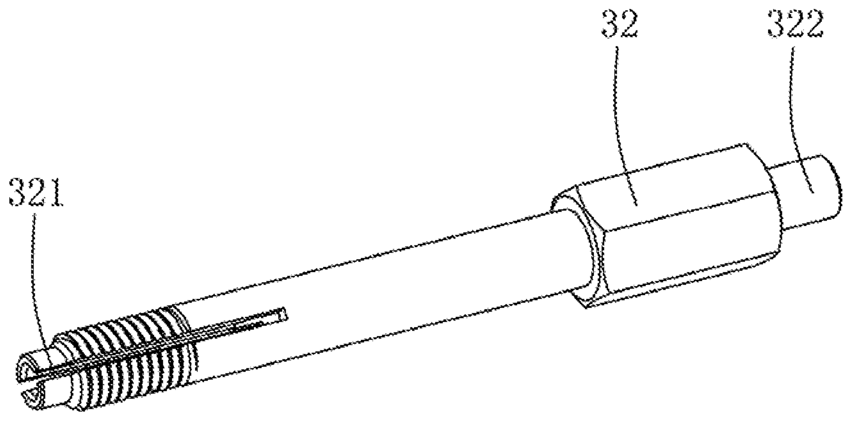
FIG. 6 is a structural view of an adjusting rod of the utility model.

During assembly, the position of the tail handle screw 111 is adjusted upon demand. To limit the displacement of the needle 3, the button 10 only needs to be pressed to push the ejector rod 9 forward, and the ejector rod 9 slides relative to the steel balls 112 during movement. As the ejector rod 9 continuously moves forward, the steel balls 112 slide to enter the second step portion 93 because the diameter of the first step portion 92 is greater than that of the second step portion 93. In such circumstances, the steel balls 112 also correspondingly leave the annular deep well 122, and the locking effect of the steel balls 112 on the locking sleeve 121 is released. Then, the locking sleeve 121 moves forward along with the button 10 by the pressure effect of the button spring 101 until the limiting boss 124 is pressed against the tail handle screw 111. At this time, the steel balls 112 are pressed between the annular shallow well 123 and the second step portion 93. Referring to FIG. 3, the ejector rod 9 cannot move backwards, thus realizing the locking position of the ejector rod 9. In this state, the axial gap between the front end of the ejector rod 9 and the locking nut 31 is the limited displacement of the needle 3. In operation, to fully open the nozzle, the locking sleeve 121 only needs to be pulled backward. When the locking sleeve 121 moves backward, the annular shallow well 123 gradually leaves the steel balls 112. When the steel balls 112 fall in the annular deep well 122 again, the locking effect of the steel balls 112 on the ejector rod 9 disappears. The button 10 drives the ejector rod 9 to move to the original position by the effect of the button spring 101 so that the steel balls 112 are pressed between the annular deep well 122 and the first step portion 92. Referring to FIG. 2, the ejector rod 9 is re-locked by the effect of the steel balls 112. In such a state, the axial distance between the locking nut 31 and the ejector rod 9 increases such that the needle 3 turns into the limit-free state, ensuring that the nozzle can fully open.

In conclusion, according to the utility model, each time the position of the tail handle screw 111 is adjusted, the ejector rod 9 can be locked at two different positions through the cooperation of the locking sleeve 121, the button 10, the ejector rod 9 and the steel balls 112, thus changing the limiting state of the needle 3. The operation is convenient and the performance is optimal.

Additionally, the front handle 1 and the tail handle 2 are connected through a connecting screw 21. The needle 3 is externally sleeved with an adjusting rod 32 and a spring adjusting screw 33, respectively. An adjusting rod spring 34 is disposed between the adjusting rod 32 and the spring adjusting screw 33. The rear end of the adjusting rod 32 passes through the spring adjusting screw 33 and is in threaded connection with the locking nut 31. The rear end of the adjusting rod 32 is axially provided with a clamping groove 321. When the locking nut 31 is in threaded connection with the adjusting rod 32, the rear end of the adjusting rod 32 shrinks with the stress and clamps the needle 3 by the effect of the clamping groove 321. The spring adjusting screw 33 is in threaded connection with the connecting screw 21. The trigger 71 is provided with a linkage block 711 for driving the needle 3 to move axially. The linkage block 711 is an eccentric arc structure. The outer circumference of the linkage block 711 is pressed against the adjusting rod 32. The front end of the adjusting rod 32 extends to form a connecting portion 322. One end, away from the trigger 71, of the linkage block 711 is movably sleeved with the connecting portion 322. The tail handle 2 is provided with a gap 22 at a position corresponding to the spring adjusting screw 33.

When the trigger 71 is pulled backward, the linkage block 711 rotates synchronously along with the trigger 71, and pushes the adjusting rod 32 back through the outer circumference thereof. Receiving the axial acting force of the linkage block 711, the adjusting rod 32 drives the needle 3 and the locking nut 31 to move backward. A gap is formed between the needle 3 and the nozzle tip 52 during the backward movement, forcing the paint to flow out via the nozzle tip 52. The distance of the needle 3 and the gap between the needle 3 and the nozzle tip 52 varies with the backward pulling angle of the trigger 71; and, the output volume of the airbrush also varies. When the trigger 71 is released, the adjusting rod 32 driven by the adjusting rod spring 34 promotes the needle 3 and the locking nut 31 to reset. In operation, a user can directly adjust the screw-in length between the spring adjusting screw 33 and the connecting screw 21 through the gap 22 reserved on the tail handle 2 to adjust the pre-tightening pressure on the adjusting rod spring 34 without dismantling the tail handle 2. The knock-down times are therefore reduced.

The air inlet valve includes a valve body 61; one end of the valve body 61 is fixedly connected with the front handle 1; and the other end of the valve body 61 is provided with an air inlet connector 62. The valve body 61 is provided with an air outlet 63. The air inlet connector 62 is internally provided with a valve rod 64 and a switching hole 65, respectively. One end of the valve rod 64 passes through the switching hole 65 and the valve body 61 in turn, and is pressed against the trigger 71. The other end of the valve rod 64 is provided with a sealing base 66 corresponding to the switching hole 65 in a sealing way. The air inlet connector 62 is also internally provided with a valve rod adjusting screw 67. An air inlet valve spring 68 is disposed between the valve rod adjusting screw 67 and one end of the valve rod 64, which is disposed near the sealing base 66.

During installation, the air inlet connector 62 is connected with an air source. When the trigger 71 is pulled, the end of the trigger 7 thrusts the vale rod 64 to drive the sealing base 66 to leave the switching hole 65, so that the compressed air in the air source flows into the air chamber A via the switching hole 65, the air outlet 63 and the air channel 82. The air then flows through the gap between the front end of the sprayer 4 and the nozzle tip 52, and then is sprayed out via the front end of the sprayer 4. After the trigger 71 is released, by the effect of the air inlet valve spring 68, the valve rod 64 drives the trigger 71 to reset. By adjusting the position state of the valve rod adjusting screw 67, the pre-tightening pressure on the air inlet valve spring 68 can be adjusted.

To avoid the paint flowing back to the rear end of the airbrush body, the accommodating cavity 7 is internally provided with a tapered sealing ring 72 and a sealing ring cap 73 in turn from the front to the rear. The sealing ring cap 73 and the tapered sealing ring 72 are both disposed between the nozzle base 8 and the trigger 71. The sealing ring cap 73 is in threaded connection with the front handle 1. The tapered sealing ring 72 is pressed between the front handle 1 and the sealing ring cap 73. This configuration sets the structure effectively and the airbrush is effectively sealed from within, thereby avoiding leakage of the paint.

The above embodiments are merely preferably embodiments of the utility model. Therefore, equivalent variations or modifications made on the basis of the structure, characteristics and principle in the scope of the patent application of the utility model shall fall within the application scope of the utility model.

What is claimed is:

1. A siphon-type airbrush, comprising a front handle, a tail handle, a needle, a sprayer, a nozzle and an air inlet valve, wherein the front handle is matched and connected with the tail handle to form an airbrush body; wherein the airbrush body is internally formed with an accommodating cavity; wherein the accommodating cavity is internally provided with the needle; wherein a feeding joint is disposed on the wall of the front handle; wherein the front handle is internally provided with a siphon channel which communicates with the feeding joint; wherein the air inlet valve is disposed at the middle part of the airbrush body; wherein the accommodating cavity is internally provided with a trigger for turning the air inlet valve on/off; wherein the triggering end of the trigger extends out of the front handle; wherein the trigger corresponds to the needle in a linkage way, such that the airbrush also comprises a nozzle base; wherein the rear end of the nozzle base is in threaded connection with the front handle; wherein the front end of the nozzle base is in threaded connection with the sprayer; wherein the nozzle includes a nozzle body; wherein the nozzle body is pressed between the sprayer and the nozzle base; wherein the front end of the nozzle body extends to form a nozzle tip; wherein an axial through-hole is disposed in the center of the nozzle base; wherein the siphon channel communicates with the axial through-hole; wherein the front end of the needle passes through the axial through-hole and the nozzle body and then extends into the nozzle tip; wherein an air chamber is formed among the sprayer, the nozzle body and the nozzle tip; wherein the front handle, the nozzle base and the nozzle body correspond to form an air channel which connects the air outlet of the air inlet valve and the air chamber; and wherein a radial gap which connects the air chamber and the surrounding air is formed between the front end of the sprayer and the nozzle tip, wherein sealing rings are respectively disposed between the front handle and the nozzle base, between the nozzle base and the sprayer, and between the nozzle base and the nozzle body, wherein the accommodating cavity is also internally provided with an ejector rod; wherein the front end of the ejector rod is axially provided with a slot to be inserted by the needle; wherein the rear end of the ejector rod extends out of the tail handle and is fixedly connected with a button; wherein the needle is fixedly connected with a locking nut which is matched with the front end of the ejector rod in a stopper; wherein a tail handle screw is disposed between the ejector rod and the tail handle; wherein the tail handle screw is in threaded connection with the tail handle; wherein a locking sleeve is movably connected between the tail handle screw and the button; wherein a pair of mounting holes are symmetrically disposed on the wall of the tail handle screw; wherein each of the mounting holes is internally and movably equipped with a steel ball; wherein the outer circumference of the rear end of the ejector rod is provided with a first step portion and a second step portion, that correspond to the steel balls, in turn from the front to the rear; wherein the diameter of the first step portion is greater than that of the second step portion; wherein an annular deep well and an annular shallow well, which are matched with the steel balls, are disposed on the inner wall of the locking sleeve in turn from the front to the rear; wherein the annular deep well and the annular shallow well run through each other; wherein a limiting boss matched with the rear end of the tail handle screw in a stopper is disposed at the middle part of the locking sleeve; and wherein a button spring is disposed between the limiting boss and the button.

2. The siphon-type airbrush according to claim 1, wherein the front handle and the tail handle are connected through a connecting screw; wherein the exterior of the needle is respectively sleeved with an adjusting rod and a spring adjusting screw; wherein an adjusting rod spring is disposed between the adjusting rod and the spring adjusting screw; wherein the rear end of the adjusting rod passes through the spring adjusting screw and then is in threaded connection with the locking nut; wherein the rear end of the adjusting rod is axially provided with a clamping groove, wherein when the locking nut is in threaded connection with the adjusting rod, the rear end of the adjusting rod shrinks with the stress and clamps the needle by the effect of the clamping groove; and wherein the spring adjusting screw is in threaded connection with the connecting screw.

3. The siphon-type airbrush according to claim 2, wherein the trigger is provided with a linkage block for driving the needle to move axially; wherein the linkage block is an eccentric arc structure; wherein the outer circumference of the linkage block is pressed against the adjusting rod; wherein the front end of the adjusting rod extends to form a connecting portion; and wherein one end of the linkage block, which is disposed away from the trigger, is movably sleeved with the connecting portion.

4. The siphon-type airbrush according to claim 2, wherein the tail handle is provided with a gap at a position corresponding to the spring adjusting screw.

5. The siphon-type airbrush according to claim 1, wherein the air inlet valve comprises a valve body; wherein one end of the valve body is fixedly connected with the front handle;

wherein the other end of the valve body is provided with an air inlet connector; wherein the valve body is provided with an air outlet; wherein the air inlet connector is internally provided with a valve rod and a switching hole, respectively; wherein one end of the valve rod successively passes through the switching hole and the valve and is pressed against the trigger; wherein the other end of the valve rod is provided with a sealing base matched with the switching hole in a sealing way; wherein the air inlet connector is also internally provided with a valve rod adjusting screw; and wherein an air inlet valve spring is disposed between the valve rod adjusting screw and one end of the valve rod, which is close to the sealing base.

6. The siphon-type airbrush according to claim 1, wherein the accommodating cavity is internally provided with a tapered sealing ring and a sealing ring cap in turn from the front to the rear; wherein the sealing ring cap and the tapered sealing ring are both disposed between the nozzle base and the trigger; wherein the sealing ring cap is in threaded connection with the front handle; and wherein the tapered sealing ring is pressed between the front handle and the sealing ring cap.

7. The siphon-type airbrush according to claim 1, wherein the exterior of the sprayer is connected and provided with a sprayer sleeve.

* * * * *